United States Patent [19]

Bladon

[11] Patent Number: 4,919,768
[45] Date of Patent: Apr. 24, 1990

[54] ELECTROPLATING PROCESS

[75] Inventor: John J. Bladon, Wayland, Mass.

[73] Assignee: Shipley Company Inc., Newton, Conn.

[21] Appl. No.: 410,907

[22] Filed: Sep. 22, 1989

[51] Int. Cl.$^5$ .............................................. C25D 5/54
[52] U.S. Cl. .................................... 204/15; 174/256; 204/30; 204/38.4; 428/698
[58] Field of Search ..................... 204/15.20, 30, 38.4; 174/68.5; 428/698

[56] References Cited

U.S. PATENT DOCUMENTS

| 844,304 | 2/1907 | Daly | 204/21 |
|---|---|---|---|
| 2,702,253 | 2/1955 | Bergstrom et al. | |
| 3,011,920 | 12/1961 | Shipley, Jr. | 117/213 |
| 3,099,608 | 7/1963 | Radovsky et al. | 204/15 |
| 3,533,918 | 10/1970 | Smith | |
| 3,658,661 | 4/1972 | Minklei | 204/30 |
| 3,874,882 | 4/1975 | Gulla et al. | 106/1 |
| 3,993,491 | 11/1976 | Feldstein | 106/1 |
| 3,993,799 | 11/1976 | Feldstein | 427/53 |
| 4,166,012 | 8/1979 | Quinn et al. | 204/30 |
| 4,683,036 | 7/1987 | Morrissey | 204/15 |

FOREIGN PATENT DOCUMENTS 0298298 1/1989 European Pat. Off. .

Primary Examiner—John F. Niebling
Assistant Examiner—William T. Leader
Attorney, Agent, or Firm—Robert L. Goldberg

[57] ABSTRACT

A method for electroplating an article of manufacture comprising an electrically nonconductive body portion comprising treatment with sequentially a solution of a stannous salt; a solution containing a dissolved sulfide capable of reacting with said stannous salt; and a solution containing a dissolved platinum family metal; followed by electrolytic metal plating of the surface of the article.

22 Claims, No Drawings

ELECTROPLATING PROCESS

BACKGROUND OF THE INVENTION

I. Introduction

This invention relates to a process for electroplating the surface of a nonconductor by forming an adherent, chemically resistant, precious metal sulfide conversion coating over the surface of the nonconductor which coating functions as a base for direct electroplating.

II. Description of the Prior Art

Nonconductive surfaces are often metallized by a sequence of steps comprising catalysis of the surface of the nonconductor followed by contact of the catalyzed surface with an electroless plating solution that deposits metal over the catalyzed surface in the absence of an external source of electricity. Following electroless metal deposition, the metal deposit is optionally enhanced by electrodeposition of a metal to desired full thickness.

Early catalyst compositions and processes for electroless metal deposition are disclosed in U.S. Pat. No. 2,702,253 incorporated herein by reference. The process comprises a sequence of two steps where the first step is immersion of a part to be plated into an acidic solution of stannous chloride. The part is then rinsed and dipped into an acidic solution of platinum group metal. The stannous chloride retained on the surface of the part provides the dual function of reducing the platinum group metal to a metal and bonds the reduced platinum group metal to the surface to be plated. The reduced platinum group metal is catalytic to deposition when in contact with an electroless metal plating solution resulting in electroless deposition over the catalyzed surface.

Problems are encountered using the two step catalyst of U.S. Pat. No. 2,702,253 for the formation of printed circuit boards because the platinum group metal, in contact with the copper cladding of a circuit board substrate, forms a platinum group metal immersion deposit that interferes with adhesion of a subsequently applied electroless metal to the copper.

An improvement in catalysis technology is disclosed and claimed in U.S. Pat. No. 3,011,920 incorporated herein by reference. The catalysts of this patent consist of an aqueous suspension of a tin - noble or precious (catalytic) metal colloid. By immersion of a part to be plated in the catalyst, colloid is adsorbed onto the surface of the part. Subsequent contact of the part with an electroless plating solution containing dissolved metal and reducing agent in solution results in plate out of metal in contact with the adsorbed catalytic metal - tin catalyst.

As is known in the art of electroless plating, the presence of a dissolved metal and a reducing agent together in solution can result in solution instability and indiscriminate deposition of metal on the walls of containers for such plating solutions. This can result in the requirement to shut down a plating line and replace the plating solution.

Attempts have been made to eliminate the need for an electroless plating solution using a direct plating sequence whereby a metal is electrolytically deposited directly over a treated nonconductive surface. One such process is disclosed in U.S. Pat. No. 3,099,608, incorporated herein by reference. The process disclosed in this patent involves treatment of the nonconductive surface with a tin palladium colloid. This is the same tin palladium colloid used as a plating catalyst for electroless metal deposition. It is possible to electroplate directly over the catalyzed surface of the nonconductor from an electroplating solution though deposition occurs by propagation from a conductive surface with deposition beginning at the interface of a conductive surface and the catalyzed nonconductive surface. The deposit grows epitaxially along the catalyzed surface from this interface. For this reason, metal deposition onto the substrate using this process is slow and the deposit often suffers thickness variation.

An improvement in the process of U.S. Pat. No. 3,099,608 is disclosed in U.K. Patent No. 2,123,036B. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin palladium colloid. The additive in the electroplating solution responsible for inhibiting deposition is described as one selected from the group of dyes, surfactants, chelating agents, brighteners and leveling agents. Many of such materials are conventional additives for electroplating solutions.

There are limitations to the above process. Both the processes of the U.S. and the U.K. patents for direct electroplating require conductive surfaces for initiation and propagation of the electroplated metal deposit. For this reason, the processes are limited in their application to metal plating of nonconductive substrates in areas in close proximity to a conductive surface.

One commercial application of the process of the U.K. patent is the metallization of the walls of through holes in the manufacture of double-sided printed circuit boards by a process known as panel plating. In this application, the starting material is a printed circuit board substrate clad on both of its surfaces with copper. Holes are drilled through the printed circuit substrate at desired locations. For conductivity, the hole walls are catalyzed with a tin palladium colloid to form the required metallic sites on the surfaces of the walls of the through holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through hole walls and rapidly propagates into the holes. The hole wall is plated to desired thickness within a reasonable period of time. Thereafter, the circuit board is finished by imaging and etching operations.

A disadvantage to the above panel plating process is that copper is electroplated over the hole wall and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, more expensive.

The art has developed a method for manufacture of printed circuit boards known as pattern plating. In this process, a printed circuit board base material is drilled at desired locations to form through holes. The through holes are metallized using conventional electroless plating techniques. Electroless copper is plated onto the walls of the through holes and over the copper cladding. Thereafter, photoresist is applied and imaged to form the circuit pattern. The board is then electroplated with copper depositing on the copper conductors and through hole walls, but not over the entire surface of the copper cladding. Solder mask is then plated over the exposed copper by immersion or electroplating and the remaining photoresist is stripped. The copper not protected by the solder is then removed by etching to form the copper circuit.

Pattern plating cannot be used with the metallizing process of the aforesaid U.K. patent. The treatment of the copper cladding prior to the application of the photoresist and the development of the photoresist, all as required for pattern plating, requires the use of treatment chemicals found to dissolve or desorb the tin palladium colloid from hole walls. Since this occurs prior to electroplating, direct electroplating to provide conductive through holes becomes impossible.

A further improvement in the art is disclosed and claimed in copending U.S. patent application Ser. No. 07/071,865 filed July 10, 1987 (now abandoned) and assigned to the same assignee as the subject application. According to the process of the this application, an electroless plating catalyst, such as that disclosed in the aforesaid U.K. patent, is treated with an aqueous solution of a sulfide, such as a sulfur solution, to convert the catalytic surface to a sulfide surface. By conversion of the surface to the sulfide conversion coating, the electroless plating catalyst is not desorbed from the surface during metallization, and consequently, in accordance with the process of said application, it is possible to pattern plate substrates in the formation of printed circuit boards.

SUMMARY OF THE INVENTION

The subject invention provides a new method for direct electroplating of the surface of a nonconductor and to articles manufactured by said method. The invention is predicated upon the discovery that sulfide films of platinum group metal formed using the two step stannous - platinum metal catalysis sequence, may be directly electroplated without the requirement for an intermediate step of electroless deposition. Another discovery of the invention is that such sulfide films are insoluble and unaffected by treatment chemicals used for plating of plastics and circuit board fabrication and therefore, the process of the invention is suitable for the formation of printed circuits using pattern plating procedures.

The process of invention is illustrated by the plating sequence for plating through holes in printed circuit formation that follows and is compared to a conventional plating process requiring electroless metal deposition.

| | Conventional Process (A) | Inventive Process (B) |
|---|---|---|
| Step 1 | desmear with chromic or sulfuric acid or plasma; | desmear with chromic or sulfuric acid or plasma; |
| Step 2 | clean and condition with detergent type material; | clean and condition with detergent type material; |
| Step 3 | microetch copper cladding; | immerse in stannous solution; |
| Step 4 | catalyst predip; | immerse in sulfide solution; |
| Step 5 | catalyze with catalytic colloid; | immerse in platinum group metal solution; |
| Step 6 | accelerate; | microetch copper cladding; and |
| Step 7 | deposit electroless metal; and | electroplate. |
| Step 8 | electroplate. | |

A comparison of the two processes illustrated above demonstrates that the process of the invention replaces the need for electroless plating with a direct electroplating step thus eliminating the need for a costly electroless metal plating solution subject to stability and disposal problems. The elimination of the electroless plating step is accomplished without an increase in the total number of steps required for metal deposition. Further, the process of the invention is found to be unaffected by conventional processing chemicals used for metal plating of plastics and formation of printed circuit boards.

Though not wishing to be bound by theory, it is believed that in the process of the invention illustrated above, contact of the tin-sulfide layer on the surface of the nonconductor with a platinum group metal containing treatment solution (Step 5) results in the formation of a platinum group metal sulfide conversion coating of the platinum group metal (the platinum group metal sulfide). The sulfide forming solution may be a simple aqueous solution of a water soluble or alkaline earth metal sulfide or a solution of a covalently bonded sulfide such as a thiocarbonate or a dithioglycolate. The platinum group metal sulfide coating adheres to the surface of the substrate to which it is applied. The coating so formed is a suitable conversion coating for direct electroplating.

For the formation of printed circuit boards using the process of the invention, it is preferred that an etching step be used subsequent to formation of the platinum group metal sulfide film over the surface of the nonconductor (Step 7 above). This etching step may use the same etchants as used in the conventional process to clean copper cladding (Step 3 above). It is preferred that the etching step be deferred to a point subsequent to the step of formation of the platinum group metal sulfide conversion coating so that the etchant may remove sulfide residues on the surface of the copper cladding.

It is an advantage of the process that the platinum group metal sulfide conversion coating over the nonconductive surface is essentially unaffected by the step of etching the copper cladding. It is a further advantage that any residues deleterious to copper-copper bonding left on the copper by a photoresist used in the manufacture of printed circuit boards may be readily removed by a more aggressive etchant than was possible in a conventional plating line where the electroless copper is only about 100 microinches thick over the hole wall.

The final step in the process comprises electroplating of the thin platinum group metal sulfide conversion coating. This is accomplished using standard electroplating procedures. The procedures of the above-referenced U.K. patent are suitable for electroplating the sulfide coating described therein.

Definitions

The term "nonconductor means an article having at least a portion of its surface inadequately conductive for direct electroplating. In the preferred embodiment of the invention, the term "nonconductor" refers to a printed circuit board base material such as a copper clad epoxy or phenol sheet.

The term "U.K. Patent" means U.K. Patent No. 2,123,036B.

The term "platinum group metal" means a metal that is catalytic to electroless metal deposition and includes those precious metals identified in U.S. Pat. No. 2,702,253.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture.

In printed circuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through holes by drilling or punching or any other method known to the art. Following formation of the holes, it is desirable to employ the conventional steps of desmearing the holes (Step 1 above) by sulfuric acid, chromic acid or plasma etching or etchback of the holes with chromic acid, followed by glass etching. Thereafter, the processing sequence of the subject invention may be employed.

Following desmearing or etchback of the holes, the circuit board base material is conventionally treated with a glass etch that removes glass fibers extending into the holes from the hole walls. This is followed by a solution that cleans the copper surface and conditions the hole wall to promote catalyst adsorption. Such solutions are often referred to as cleaner conditioners and typically comprise an aqueous alkaline surfactant solution for cleaning soil and a quaternary amine to condition the hole wall. This treatment step, by itself, is old in the art and does not constitute a part of the invention. Proprietary cleaner conditioners are commercially available, and a suitable material is available from Shipley Company Inc. of Newton, Mass. and identified as Cleaner Conditioner 1175.

The next step in the process comprises immersion of the surface of the nonconductor in a solution of a stannous salt. Any stannous salt such as a stannous halide, stannous sulfite, stannous acetate, etc. is suitable. Stannous chloride is most preferred. The concentration of tin in solution may vary from about 0.01 molar to saturation, preferably varies from about 0.1 to 5.5 molar and most preferably varies between 1.0 and 3.5 molar.

Sufficient acid is used to fully dissolve the stannous salt. Preferably, the acid concentration is at least one normal. The acid used may be any known acid used for catalysis but preferably has an anion common to the stannous salt. The preferred stannous salt used is stannous chloride and hydrochloric acid is the preferred acid. In a preferred embodiment of the invention, the stannous solution also contains an alcohol, methanol being a preferred alcohol. The alcohol may be present in an amount of from about 5 to 250 mls per liter of solution and preferably varies between about 25 and 150 mls per liter of solution.

The treatment conditions for immersion of a part in the stannous treatment solution are not critical. Preferably, treatment times vary from 30 seconds to 10 minutes, and more preferably, between 2 minutes and 6 minutes. Temperature may vary from room temperature to near boiling temperature but room temperature treatment is preferred.

Following a water rinse, the part to be plated is immersed in a sulfide forming treatment solution comprising a sulfide salt dissolved in a suitable solvent. For metal plating operations, aqueous solutions are preferred, and in accordance with a preferred embodiment of the invention, an aqueous solution of a water soluble sulfide salt may be used. Most preferred are alkaline earth metal sulfides such as sodium, potassium and lithium sulfide. The concentration range of sulfide in solution may vary from about 0.00001 to 1.0 molar, but a preferred concentration of sulfide varies between 0.0001 and 0.1 molar, and, most preferably, ranges between about 0.1 and 0.01 molar. Though not wishing to be bound by theory, it is believed that the sulfide must be present in sufficient concentration to convert subsequently applied platinum group metal to a satisfactory coating, but excess sulfide may inhibit deposition rate.

In addition to inorganic sulfides, covalently bonded materials may be used to form the sulfide conversion coating. A metal thiocarbonate solution is an example of a covalently bonded sulfide compound. The covalently bonded sulfides are used in concentrations and under conditions equivalent to those set forth above for the simple sulfide solution. However, in accordance with the subject invention, simple salts of sulfides may be preferred to covalently bonded sulfide compounds when used in the low range of concentrations.

Following treatment with the sulfide solution, and a water rinse, the part is then immersed in an acidic platinum group metal solution. The platinum group metal corresponds to those platinum group metals disclosed in U.S. Pat. No. 3,011,920 and includes such metals as platinum, palladium, gold, rhodium, etc. Palladium is the preferred platinum group metal. The cation of the platinum group metal compound may be any of those contemplated for electroless plating catalysts such as halide salts, acetates, etc. The preferred cation is chloride. The concentration of the platinum group metal in solution may vary between about 0.001 and 0.01 molar, but preferably varies between about 0.005 and 0.05 molar. The acid used to dissolve the platinum group metal salt is used in a concentration sufficient for complete dissolution. Preferably, the acid solution is 1 normal in acid and preferably greater than 2 normal. The acid used is any acid conventionally used for formation of electroless plating catalysts, but preferably is one having an cation common to the platinum group metal salt. Where palladium chloride is the preferred platinum group metal salt, hydrochloric acid is the preferred acid.

In accordance with the process disclosed herein, treatment with the platinum group metal solution results in the formation of a conversion coating that appears as a dark brown to black coating. This coating is suitable for direct electroplating. If the nonconductor is a copper clad printed circuit base material, the copper cladding should be cleaned such as, for example, by use of a sulfuric acid - hydrogen peroxide pre-etch. The etchant should be used at room temperature for a period of time ranging between 1 and 3 minutes. It should be noted that unexpectedly, treatment with the etchant does not result in attack upon the platinum group metal sulfide conversion coating of the invention.

The next step in the process of the invention comprises electroplating directly over the conversion coating avoiding the intermediate step of electroless metal plating. The electroplating procedure is similar to the procedure disclosed in the above referenced U.K. patent, but careful control of the electroplating parameters as required in the process of the U.K. patent is not necessary in the process of this invention. The electroplating process may use electroplating solutions such as those disclosed in the U.K. patent, but most commercially available electroplating solutions contain additives which make most commercially available electroplating solutions suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, flouroboric acid, sulfamic acid, etc. Dyes typically used in such baths include methylene blue, methyl violet, and other N-heterocyclic compounds. Suitable surfactants included i such baths typically include non-ionic surfactants such as alkylphenoxy polyethoxyethanols. Surfactants include wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 10 through 40 amps per $ft^2$. A preferred current density range is from 15 to 30 amps per $ft^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The chemical resistance of the platinum group metal sulfide conversion coating to treatment solutions permits simplified printed circuit board manufacturing processes impractical or inoperative in the prior art. For example, a pattern plating sequence, as described above, could not be used with the direct electroplating process of the U.K. Patent because the pretreatment steps would remove or dissolve adsorbed colloid thereby making it impossible to first treat and image and then electroplate. This is a serious disadvantage because it severely limits the type of circuit board that can be fabricated using the process of the U.K. Patent. The platinum group metal sulfide conversion coating of the subject invention remains unaffected when contacted with treatment chemicals required for pattern plating. Therefore a pattern plating process for formation of printed circuit boards is possible using the process of the subject invention. Such a process is illustrated in the sequence of steps described below using a predrilled and desmeared copper clad circuit board base material:

| | Pattern Plating Sequence |
|---|---|
| Step 1 | clean and condition; |
| Step 2 | treat with stannous solution; |
| Step 3 | treat with sulfide solution; |
| Step 4 | treat with platinum group metal solution; |
| Step 5 | acid clean copper cladding; |
| Step 6 | apply and image photoresist; |
| Step 7 | develop photoresist image; |
| Step 8 | clean and then microetch copper cladding; |
| Step 9 | electroplate; |
| Step 10 | apply solder resist; |
| Step 11 | remove remaining photoresist; and |
| Step 12 | remove copper bared by removal of photoresist. |

Step 4 above results in the formation of the platinum group metal sulfide conversion coating of the invention. Pattern plating is possible in accordance with the invention because the etchants and alkaline developers used to develop the photoresist layer do not adversely effect or inactivate the sulfide conversion coating. These same materials would inactivate, desorb or dissolve the palladium tin colloidal coating used for direct electroplating in the process of the U.K. Patent.

The invention will be better understood by reference to the Examples which follow where, unless stated otherwise, the substrate treated was an epoxy copper clad circuit board base material provided with a random array of through holes and commercial formulations are available from Shipley Company Inc. of Newton, Mass.

EXAMPLE 1

The following examples illustrate the formation of a sulfide conversion coating over a substrate followed by electroplating.

For this example, a first solution [Solution A] of a stannous salt was prepared having the following formulation:

Stannous sulfate: 80 gm
Sulfuric acid (conc.): 32 ml
methanol,: 100 ml
deionized water: 868 ml A circuit board substrate material was subjected to the following procedure:

Step 1: Pre-Clean and Condition a. desmear the hole walls with concentrated sulfuric acid maintained at a temperature of 70° for 20 seconds and rinse;

b. remove glass fibers extending into the holes by etching with an ammonium bifluoride solution (1 lb./gal.) maintained at 70° F. for 4 minutes and water rinse;

c. clean and condition the copper cladding and hole walls using an alkanolamine based solution containing proprietary surfactants identified as Cleaner Condition 231 at 10% strength at a temperature of 110° F. for 10 minutes and water rinse.

Step 2: Form Sulfide Coating a. immerse the substrate in solution A for 5 minutes at 75° F.;

b. immerse the substrate in a room temperature 0.01 molar aqueous sulfide solution for 5 minutes and water rinse; and c immerse the substrate in a 10 percent v/v solution of a 20 percent v/v concentrated hydrochloric acid solution of palladium chloride having a palladium chloride concentration of 7.0 grams per liter at a temperature of 75° F. for 10 minutes and water rinse.

The board prepared by the preceding steps was observed for appearance. The copper surface of the board had a gray film over its surface.

The board prepared in accordance with Steps 1 and 2 having a sulfide conversion coating was electroplated using the following sequence of steps:

Step 3: Remove Conversion Coating From Copper

Immerse the coated board in a peroxide sulfuric etchant identified as Pre-Etch 746 etchant at a temperature of 75° F. for 5 minutes and water rinse.

Step 4: Microetch the Copper Surfaces

Immerse the board in a 50 percent normal hydrogen peroxide solution at room temperature for 1 minute and water rinse.

Step 5: Electroplate

Electroplate copper from an acid copper electroplating bath identified as Electroposit ® 276 acid copper at a current density of 25 amps/sq. ft. and at a temperature of 75° F. for 30 minutes and water rinse. Treatment of the 1 board with the peroxide etchant (step 4) resulted in flakes of precipitate floating in the bath. The origin of this material is the film on the copper surface. The film can be seen lifting off the copper surfaces when the board is immersed in the bath. Copper plated onto the wall of the through holes and onto the copper cladding exhibit excellent bond strength.

EXAMPLE 2

The procedure of Example 1 is repeated substituting the following treatment solution for Solution A in step 2 (a):

| | |
|---|---|
| Stannous chloride (5.27M in 10% v/v of 37% HCl) | 100 ml |
| methanol | 100 ml |
| deionized water | 800 ml |

All other treatment steps are the same.

This example constitutes a preferred embodiment of the invention.

EXAMPLE 3

This example demonstrates a hypothetical process for panel plating. A board would be prepared following the procedures defined in steps 1 through 5 of Example 2. Following electrolytic deposition over the sulfide conversion coating, the following steps may be used:

Step 6: Apply and Image Photoresist a. dry the cleaned boards;

b. apply a dry film of Riston ® 3015 photoresist (available from E. I. DuPont de Nemours and Company of Wilmington, Del.) at an application temperature of between 98 and 110° C. and at a speed of from 1 to 3 ft/min. and wait 15 minutes following application of the film; and c. expose the film to a source of activating energy to obtain the desired circuit pattern at an exposure of 40 mJ/cm and then wait 15 minutes.

Step 7: Develop Imaged Photoresist

Place the imaged board in a spray chamber using a solution consisting of 5 pound of sodium carbonate and 1 gallon of butyl carbitol per 60 gallons and develop at a temperature of 85° F. for 1 minute.

Step 8: Electroplate Solder

Immerse the substrate in a tin/lead fluoroborate plating solution identified as Electroposit 280 Tin/Lead at a temperature of 85° F. using a cathode current density of between 10 and 40 amps/sq. ft. for 60 minutes.

Step 9: Remove Photoresist

Spray the board with a 2 % potassium hydroxide solution at a temperature of 85° F. for 1 minute.

Step 10: Etch Copper

Spray the board with an ammoniacal copper etchant at 110° F. until all of the exposed copper is removed.

EXAMPLE 4

The following example demonstrates a hypothetical process for pattern plating in the formation of a printed circuit board using the process of the invention.

A board would be prepared following the procedures defined in steps 1 through 3 of Example 2. Following formation of the sulfide conversion coating and the removal of sulfide coating from copper surfaces, the following steps would be followed:

Step 4: Apply and Image Photoresist a. dry the cleaned boards;

b. apply a dry film of Riston ®3015 photoresist available from E. I. DuPont de Nemours and Company of Wilmington, Del. at an application temperature of between 98 and 110° C. and at a speed of from 1 to 3 ft/min. and wait 15 minutes following application of the film; and c. expose the photoresist film to a source of activating energy through a master to obtain the desired circuit pattern at an exposure of 40 mJ/cm and wait 15 minutes.

Step 5: Develop the Photoresist

Place the substrate in a spray chamber suing a solution consisting of 5 pounds of sodium carbonate and 1 gallon of butyl carbitol per 60 gallons of developer and develop at a temperature of 85° F. for 1 minute.

Step 6: Clean Copper

Immerse the sulfide coated board in Acid Cleaner 811 at 110° F. for 1 minute and water rinse.

Step 7: Microetch Copper Surfaces

Immerse the board in a persulphate etchant (¼lb./gallon) identified as Pre-Etch 748 at a temperature of 70° F. for 1 minute and water rinse.

Step 8: Electroplate

Electroplate copper from an acid copper electroplating bath identified as Electroposit ®892 acid copper at a current density of 30 amps/sq. ft. and at a temperature of 70° F. for 30 minutes and water rinse.

Step 9: Electroplate Solder

Immerse the developed board in a tin/lead fluoroborate plating solution identified as Electroposit 280 Tin/Lead at a temperature of 85° F. suing a cathode current density of between 10 and 40 amps/sq. ft. for 60 minutes.

Step 10: Remove Photoresist

Spray the board with a 2% potassium hydroxide at a temperature of 85° F. for 1 minute.

Step 11: Etch Copper Surfaces

Spray the boards with an ammoniacal copper etchant at 110° F. until all of the exposed copper is removed.

I claim:

1. A method for electroplating an article of manufacture comprising an electrically nonconductive body portion, said method comprising the steps of:
    (a) treating the surface of said nonconductor with a solution of a stannous salt;
    (b) treating the surface of the nonconductor with a solution containing a dissolved sulfide capable of combining with said stannous salt;
    (c) treating the surface of the nonconductor with a solution containing a dissolved platinum family metal; and
    (d) metal plating the surface of the article by passing a current between electrodes immersed in an electrolyte containing dissolved plating metal, one of said electrodes comprising said nonconductor to be plated, said nonconductor having at least a portion of its surface coated with the coating formed by steps (a) through (c) herein.

2. The method of claim 1 where the stannous solution includes an alcohol.

3. The method of claim 1 where the stannous solution is a solution of a stannous halide.

4. The process of claim 3 where the stannous halide is stannous chloride.

5. The process of claim 3 where the stannous content is at least 0.01 molar.

6. The process of claim 5 where the stannous content varies between 1.0 and 3.5 molar.

7. The process of claim 1 where the sulfide containing solution is an aqueous solution of a sulfide salt.

8. The process of claim 7 where the sulfide salt is an alkali metal sulfide.

9. The process of claim 7 where the sulfide content ranges between 0.00001 and 1.0 molar.

10. The process of claim 7 where the sulfide content ranges between 0.1 and 0.01 molar.

11. The process of claim 1 where the platinum family metal solution is a solution of a platinum family metal salt selected from the group consisting of platinum and palladium salts.

12. The process of claim 11 where the platinum family metal is palladium.

13. The process of claim 12 where the solution is an aqueous acidic solution of palladium.

14. The solution of claim 13 where the solution is a palladium chloride solution in hydrochloric acid.

15. The process of claim 11 where the platinum family metal content varies between 0.001 and 0.01 molar.

16. The process of claim 15 where the concentration varies between 0.005 and 0.01 molar.

17. The method of claim 1 where the article is plated with copper.

18. The method of claim 1 where the article is plated with solder.

19. An article of manufacture formed by the process of claim 1.

20. The article of claim 19 where the article is a printed circuit board.

21. The article of claim 20 where the printed circuit board has plated through holes.

22. An article of manufacture formed by the process of claim 14.

* * * * *